United States Patent
Zhao et al.

(10) Patent No.: US 12,004,426 B2
(45) Date of Patent: Jun. 4, 2024

(54) TERAHERTZ DETECTOR AND METHOD OF MANUFACTURING TERAHERTZ DETECTOR

(71) Applicants: NUCTECH COMPANY LIMITED, Beijing (CN); Tsinghua University, Beijing (CN)

(72) Inventors: Ziran Zhao, Beijing (CN); Yingxin Wang, Beijing (CN); Meng Chen, Beijing (CN); Xuming Ma, Beijing (CN)

(73) Assignees: NUCTECH COMPANY LIMITED, Beijing (CN); Tsinghua University, Beijing (CN)

( * ) Notice: Subject to any disclaimer, the term of this patent is extended or adjusted under 35 U.S.C. 154(b) by 353 days.

(21) Appl. No.: 17/418,967

(22) PCT Filed: Oct. 10, 2019

(86) PCT No.: PCT/CN2019/110339
§ 371 (c)(1),
(2) Date: Jun. 28, 2021

(87) PCT Pub. No.: WO2020/134327
PCT Pub. Date: Jul. 2, 2020

(65) Prior Publication Data
US 2022/0115576 A1    Apr. 14, 2022

(30) Foreign Application Priority Data

Dec. 28, 2018 (CN) .......................... 201811631501.4

(51) Int. Cl.
*H10N 15/10* (2023.01)

(52) U.S. Cl.
CPC .................................. *H10N 15/15* (2023.02)

(58) Field of Classification Search
CPC .... H01G 9/2004; H01G 9/2095; H01G 9/209; H01G 9/2059; H01G 9/0029; H01G 9/2045; H10N 15/10; H10N 15/15
(Continued)

(56) References Cited

U.S. PATENT DOCUMENTS

2016/0161340 A1   6/2016  Colli
2016/0305824 A1  10/2016  Ozyilmaz et al.
(Continued)

FOREIGN PATENT DOCUMENTS

CN     103575407 A     2/2014
CN     104993056 A    10/2015
(Continued)

OTHER PUBLICATIONS

International Search Report and Written Opinion of the International Searching Authority for International Patent Application No. PCT/CN2019/110339 dated Jan. 6, 2020, 10 pages.
(Continued)

*Primary Examiner* — Terrance L Kenerly
(74) *Attorney, Agent, or Firm* — Merchant & Gould P.C.

(57) ABSTRACT

A terahertz detector and a method of manufacturing a terahertz detector, wherein the terahertz detector including a substrate (2) and at least one detection unit. Each detection unit includes: a channel material (1) arranged on the substrate, two electrodes (3, 4) respectively in ohmic contact with both ends of the channel material (1) in a longitudinal direction, and a three-dimensional grapheme (5) in direct or indirect thermal contact with the channel material (1).

19 Claims, 3 Drawing Sheets

(58) Field of Classification Search
USPC .......................................................... 310/306
See application file for complete search history.

(56) References Cited

U.S. PATENT DOCUMENTS

2018/0053871 A1   2/2018   Amirmazlaghani et al.
2018/0315880 A1   11/2018  Jadidi et al.

FOREIGN PATENT DOCUMENTS

| CN | 104465850 B | 9/2016 |
| CN | 105957955 A | 9/2016 |
| CN | 107482109 A | 12/2017 |
| CN | 107720728 A | 2/2018 |
| CN | 109494293 A | 3/2019 |
| CN | 209232819 U | 8/2019 |
| EP | 3220113 A1 | 9/2017 |
| EP | 3 296 028 A1 | 3/2018 |
| JP | WO2012093443 * 7/2012 ........... H01G 9/2059 |
| WO | 2017188438 A1 | 11/2017 |
| WO | 2018050372 A1 | 3/2018 |
| WO | 2018207780 A1 | 11/2018 |

OTHER PUBLICATIONS

Extended European Search Report dated Nov. 18, 2022 for corresponding European Application No. 19901843 (7 pages).
Ogawa Shinpei et al. "Broadband photoresponse of graphene photodetector from visible to long-wavelength Infrared wavelengths", Proccedings of SPIE, 2018, (10624):1062415, XP060107299, DOI: 10.1117/12.2303700 (8 pages).
Office Action dated Mar. 6, 2024 for corresponding Chinese Application No. 201811631501.4 (16 pages including English Translation).
Meng Chen, et al., "Fast Photothermoelectric Response of 3D Graphene Foam in the Terahertz Range", Advanced Photonics Congress, Jul. 5, 2018, 2 pages.

* cited by examiner

TERAHERTZ DETECTOR AND METHOD OF MANUFACTURING TERAHERTZ DETECTOR

CROSS REFERENCE TO RELATED APPLICATION(S)

This application is a Section 371 National Stage Application of International Application No. PCT/CN2019/110339 filed on Oct. 10, 2019, entitled "TERAHERTZ DETECTOR AND METHOD OF MANUFACTURING TERAHERTZ DETECTOR", which claims priority to Chinese patent Application No. 201811631501.4, filed on Dec. 28, 2018, the content of which are incorporated herein by reference in their entirety.

TECHNICAL FIELD

The present disclosure relates to a field of terahertz detection technology, and in particular to a terahertz detector and a method of manufacturing a terahertz detector.

BACKGROUND

Terahertz wave is a general term for electromagnetic waves in a specific band, generally referring to electromagnetic waves with an oscillation frequency between 0.1 THz and 10 THz. Due to a special position in an electromagnetic spectrum, terahertz wave has characteristics of good penetration, low single-photon energy and rich spectral information, and has an important application value in security imaging, spectral detection, information communication and other fields.

At present, widely used room temperature terahertz detector includes field effect tube detector, Schottky detector, and terahertz detector. The Schottky detector and the field effect tube detector may achieve high detection sensitivity, but have a spectral response range currently limited to a band below 1 THz, and have high requirements for processing technology. The terahertz detector has advantages of wide response frequency, good stability, and easy array integration. It is a room temperature terahertz detector closest to commercial applications and has received extensive attention from scientific researchers. However, in current terahertz detector, a channel material has low absorption efficiency for terahertz wave and slow response to thermal effect, and generally has problems such as insufficient gain magnification, complex processing technology, and difficult application to terahertz wave. In addition, traditional photothermoelectric detector generally requires a terahertz field to irradiate both sides of the channel material asymmetrically in order to obtain an asymmetric temperature field distribution, which severely limits practicability and integration of the detector.

SUMMARY

An objective of the present disclosure is to solve at least one aspect of the problems and defects existing in a related art described above.

According to an embodiment of an aspect of the present disclosure, there is provided a terahertz detector, including:
a substrate; and
at least one detection unit, wherein each detection unit includes:
a channel material arranged on the substrate;
two electrodes respectively in ohmic contact with both ends of the channel material in a longitudinal direction; and
a three-dimensional graphene in direct or indirect thermal contact with the channel material.

In some embodiments, the three-dimensional graphene is in direct or indirect thermal contact with one end of the channel material.

In some embodiments, the three-dimensional graphene is arranged at a contact between the channel material and the electrode.

In some embodiments, the substrate has a U-shaped structure, both ends of the channel material in the longitudinal direction are respectively fixed on both side portions of the U-shaped structure, and the three-dimensional graphene is arranged between a bottom of the U-shaped structure and the channel material.

In some embodiments, the three-dimensional graphene is adhered to the channel material.

In some embodiments, each electrode has two ends that extend to an outside of the channel material in a direction perpendicular to the longitudinal direction of the channel material and that are connected to the substrate.

In some embodiments, the three-dimensional graphene has a cuboid structure with a long side parallel to the longitudinal direction of the channel material.

In some embodiments, the substrate includes a first substrate and a second substrate arranged at a distance from the first substrate, the channel material of each detection unit has a first end in the longitudinal direction that is connected to the first substrate, and a second end in the longitudinal direction that protrudes from a side of the second substrate away from the first substrate, both electrodes of each detection unit are respectively arranged on the first substrate and the second substrate, and the three-dimensional graphene is arranged on the second substrate and is in thermal contact with the second end of the channel material protruding from the second substrate.

In some embodiments, the substrate includes a first substrate and at least one second substrate arranged at a distance from the first substrate, the at least one detection unit is arranged in a one-to-one correspondence with the at least one second substrate; the channel material of each detection unit is arranged on the second substrate, first ends of both electrodes of each detection unit are connected to the first substrate and protrude from a side of the first substrate away from the second substrate, and second ends of both electrodes of the each detection unit are in ohmic contact with both ends of the channel material arranged on the second substrate in the longitudinal direction, and the three-dimensional graphene is arranged on the second substrate.

In some embodiments, the terahertz detector further includes an insulating and thermally conductive layer arranged between the channel material and the three-dimensional graphene.

In some embodiments, the first end of each electrode is provided with a tapered pin structure.

In some embodiments, the plurality of detection units are arranged in a plane array or a linear array.

According to an embodiment of another aspect of the present disclosure, there is provided a method of manufacturing a terahertz detector, including:
preparing a channel material;
transferring the channel material to a substrate;
making two electrodes on both ends of the channel material;
preparing a three-dimensional graphene; and fixing the three-dimensional graphene to the channel material.

DETAILED DESCRIPTION OF EMBODIMENTS

Although the present disclosure will be fully described with reference to the drawings containing the preferred embodiments of the present disclosure, it should be understood that those skilled in the art may modify the present disclosure while obtaining the technical effects of the present disclosure. Therefore, it should be understood that the above description is a broad disclosure for those ordinary skilled in the art, and its content is not intended to limit the exemplary embodiments described in the present disclosure.

In addition, in the following detailed description, for the convenience of explanation, many specific details are set forth to provide a comprehensive understanding of the embodiments of the present disclosure. Obviously, however, one or more embodiments may also be implemented without these specific details. In other cases, well-known structures and devices are shown in diagrammatic form to simplify the drawings.

According to a general inventive concept of the present disclosure, there is provided a terahertz detector, including a substrate and at least one detection unit. Each detection unit includes: a channel material arranged on the substrate, two electrodes respectively in ohmic contact with both ends of the channel material in a longitudinal direction, and three-dimensional graphene in direct or indirect thermal contact with the channel material. In the terahertz detector and the method of manufacturing the terahertz detector described according to the embodiments of the present disclosure, the problem of insufficient absorption of terahertz wave by the channel material may be solved by using the three-dimensional graphene in direct or indirect contact with the channel material as an absorber for the terahertz wave, so that a response sensitivity of the detector may be effectively improved. In addition, since the three-dimensional graphene may achieve efficient absorption of terahertz waves of full band, large incident angle and arbitrary polarization state, the terahertz detector has advantages of wide operation bandwidth, strong angle adaptability, and no difference in polarization.

Figure 1:
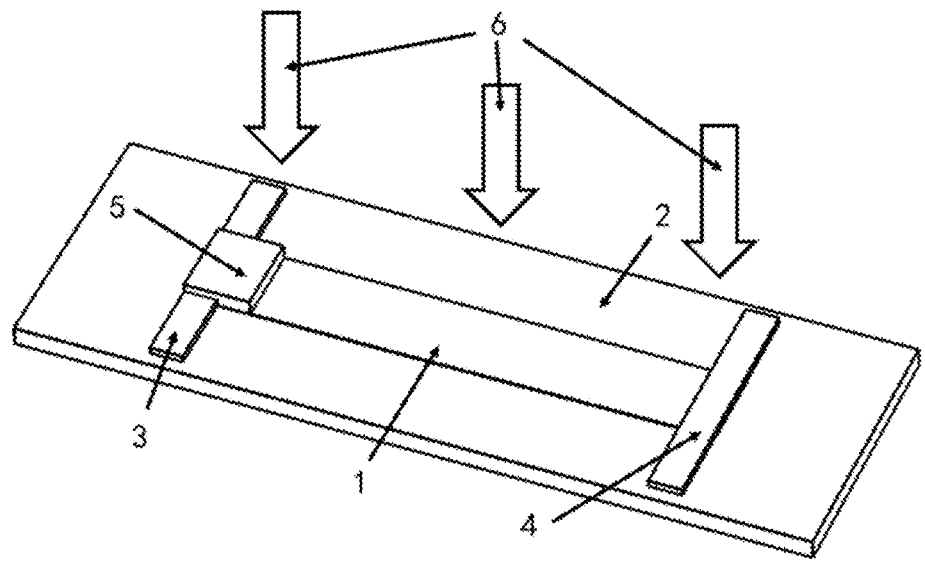
FIG. 1 shows a schematic structural diagram of a terahertz detector according to an exemplary embodiment of the present disclosure.

FIG. 1 shows a schematic structural diagram of a terahertz detector according to an exemplary embodiment of the present disclosure. As shown in FIG. 1, the terahertz detector includes a substrate 2 and a detection unit. The substrate 2 is suitable for providing a stable mechanical support for the entire terahertz detector. It is a single-layer cuboid sheet formed of suitable thermoelectric materials including but are not limited to high-resistance silicon, silicon nitride, silicon dioxide, silicate glass, and so on. The detection unit includes a channel material 1, two electrodes 3 and 4, and a three-dimensional graphene 5. The channel material 1 is located on the substrate 2 and is used to convert heat conducted from the three-dimensional graphene 5 into an electrical signal that is convenient for direct detection. The channel material 1 may be formed of materials with good thermoelectric properties, including but not limited to graphene, carbon nanotubes, transition metal chalcogenides, and so on. The electrodes 3 and 4 are respectively located at both ends of the channel material 1 in the longitudinal direction, and form a good ohmic contact with the channel material 1, so as to transmit the electrical signal generated by the channel material 1 to an electrical detection instrument (not shown)) for measurement. The electrodes 3 and 4 may be made of metal materials with good electrical conductivity. The three-dimensional graphene 5 is connected to the substrate 2 and is located above a contact between the electrode 3 and the channel material 1, and is in direct thermal contact with the electrode 3 and the channel material 1.

When in use, the terahertz detector is firstly fixed on a firm and reliable optical support to face a terahertz wave 6 to be measured. When the terahertz wave 6 to be measured irradiates a surface of the detector, the three-dimensional graphene 5 may absorb the terahertz wave 6 to be measured and transfer energy to the channel material 1 in the form of heat, which may cause an increase of a temperature at an end of the channel material 1 close to the electrode 3. As a result, a temperature difference is formed at both ends of the channel material 1, which leads to a photothermoelectric effect and generates a thermoelectromotive force between the electrodes 3 and 4. By measuring the thermoelectromotive force using the electrical detection device, an intensity of the terahertz wave 6 to be measured may be obtained.

The three-dimensional graphene 5 is formed of thin layers of graphene densely staggered in a three-dimensional space and has a certain mechanical strength. In the three-dimensional graphene 5, many pore structures of varying sizes are formed between the thin layers of graphene. The size of these pores is on the order of tens of microns to hundreds of microns, which corresponds to a wavelength of the terahertz wave. Therefore, the terahertz wave incident on the surface of the three-dimensional graphene 5 may be strongly scattered and diffracted, and repeatedly oscillate in the three-dimensional graphene 5, and thus largely absorbed by the three-dimensional graphene. According to statistics, absorptivity of the three-dimensional graphene 5 in the terahertz band may generally reach more than 99%. By using the three-dimensional graphene 5 as an absorber, the detector proposed in the present disclosure may solve the problem of insufficient absorption of the terahertz wave 6 to be measured by the channel material 1, so that the response sensitivity of the detector may be effectively improved.

In addition, the three-dimensional graphene 5 may achieve efficient absorption of terahertz waves of full band, large incident angle and arbitrary polarization state, as long as the terahertz wave 6 irradiates a front of the device. Therefore, the terahertz detector has advantages of wide operation bandwidth, strong angle adaptability, and no difference in polarization, so that the terahertz detector may have a broader application range and better stability than a detector that relies on an antenna to collect the terahertz wave 6.

In the terahertz detector provided by this embodiment, the three-dimensional graphene 5 is in direct or indirect thermal contact with one end of the channel material 1 in the longitudinal direction so as to obtain an asymmetrical absorption effect. In this way, the detector may operate in a uniform terahertz field environment, which makes the detector easy to integrate and more practical. Moreover, a shape, a size and a position of the three-dimensional graphene 5 may be flexibly adjusted, which provides convenience for overcoming shortcomings of detection mechanism and improving performance of the detection device.

It should be noted that although the terahertz detector in the embodiments described above performs detection through the photothermalelectric effect, those skilled in the art should understand that in some other embodiments of the present disclosure, radiant thermal effect and pyroelectric effect may also be used.

Figure 2:
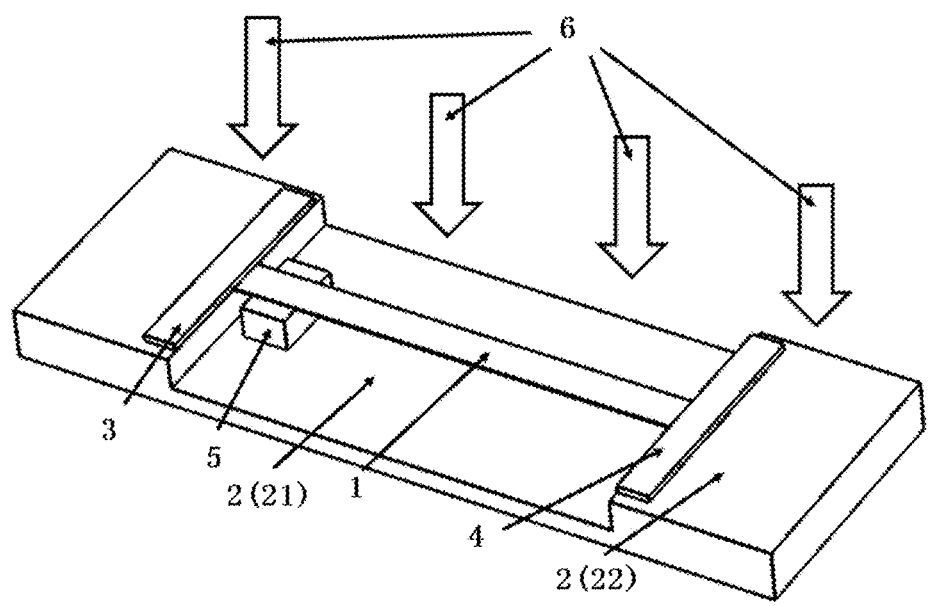
FIG. 2 shows a schematic structural diagram of a terahertz detector according to another exemplary embodiment of the present disclosure.

FIG. 2 shows a terahertz detector according to another exemplary embodiment of the present disclosure. As shown in FIG. 2, the terahertz detector includes a substrate 2 and a detection unit. Different from the embodiment shown in FIG. 1, the substrate 2 has a U-shaped structure, and both ends of the channel material 1 are respectively fixed on two side portions 22 of the U-shaped structure, so that a middle portion of the channel material 1 is suspended, that is, not in contact with the substrate 2. The three-dimensional graphene 5 is arranged between a bottom 21 of the U-shaped structure and the channel material 1.

As shown in FIG. 2, in an exemplary embodiment, a bottom of the three-dimensional graphene 5 is firmly connected to the bottom 21 of the substrate, and a top of the three-dimensional graphene 5 is in thermal contact with the channel material 1. For example, the three-dimensional graphene 5 may be adhered to the channel material 1 through conductive silica gel.

As shown in FIG. 1 and FIG. 2, in some embodiments, both ends of the electrodes 3 and 4 extend to the outside of the channel material 1 in a direction perpendicular to the longitudinal direction of the channel material 1, and are connected (for example, adhered) to the substrate 2.

As shown in FIG. 1 and FIG. 2, in some embodiments, the three-dimensional graphene 5 has a cuboid shape with a long side parallel to the longitudinal direction of the channel material 1, so as to increase a contact area with the channel material 1. It should be noted that in some other embodiments of the present disclosure, the three-dimensional graphene 5 may also be implemented to have other shapes, such as a shape with an isosceles trapezoid cross section.

Figure 3:
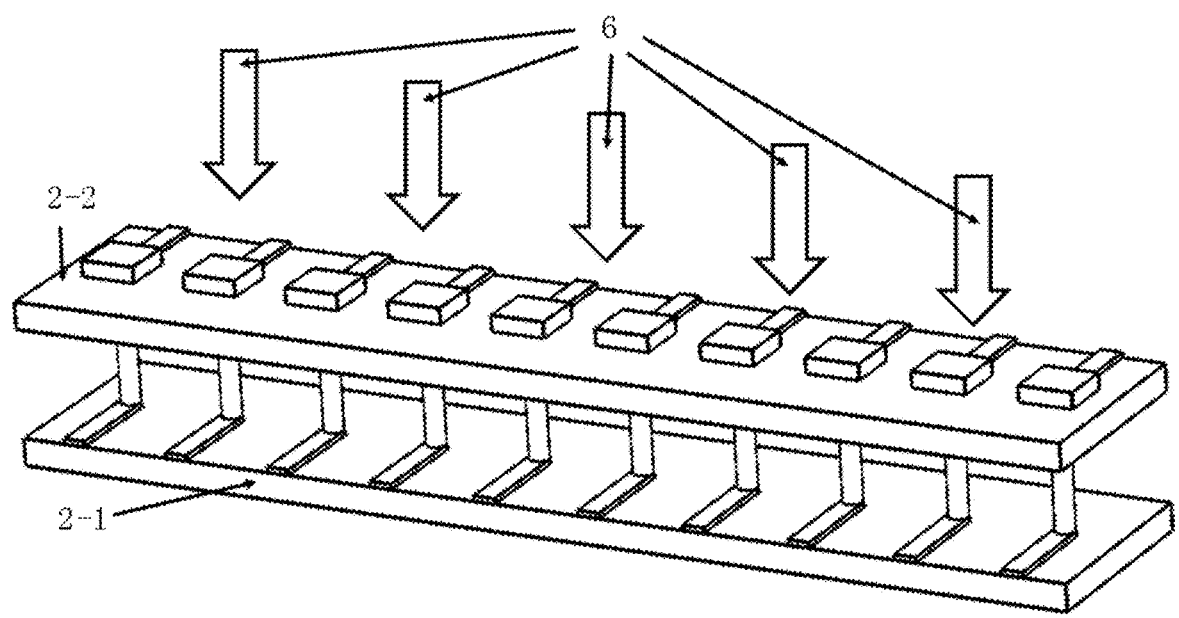
FIG. 3 shows a schematic structural diagram of a terahertz detector according to another exemplary embodiment of the present disclosure, where the terahertz detector includes a plurality of detection units arranged in a linear array.
Figure 4:
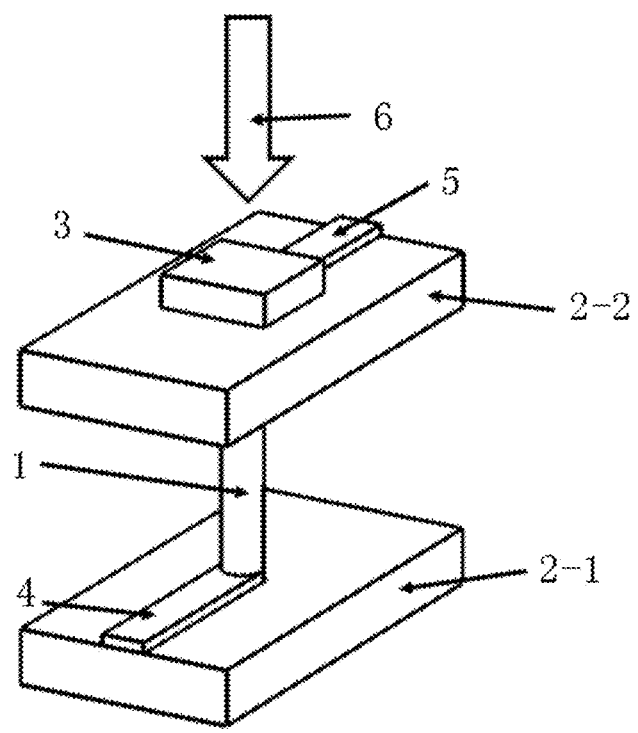
FIG. 4 shows a schematic structural diagram of a detection unit of the terahertz detector shown in FIG. 3.

FIG. 3 and FIG. 4 show a terahertz detector according to another exemplary embodiment of the present disclosure. As shown in FIG. 3 and FIG. 4, the terahertz detector includes a substrate 2 and a plurality of detection units arranged in a linear array. The substrate 2 includes a first substrate 2-1 and a second substrate 2-2 substantially parallel to and arranged at a certain distance from the first substrate 2-1. The channel material 1 of each detection unit has a first end in the longitudinal direction that is connected to the first substrate 2-1, and a second end in the longitudinal direction that is connected to the second substrate 2-2 and protrudes from a side of the second substrate 2-2 away from the first substrate 2-1. The electrode 4 is arranged on the first substrate 2-1 and forms a good ohmic contact with the first end of the channel material 1. The electrode 3 is arranged on the second substrate 2-2 and forms a good ohmic contact with the second end of the channel material 1. The three-dimensional graphene 5 is arranged on the second substrate 2-2 and forms good thermal contact with the second end of the channel material 1. The three-dimensional graphene 5 may completely cover the second end of the channel material 1 and a part of the electrode 3.

Although a plurality of detection units arranged in a linear array are shown in this embodiment, it should be noted that in some other embodiments of the present disclosure, it is also possible to provide only one such detection unit or a plurality of such detection units arranged in a plane array.

Figure 5:
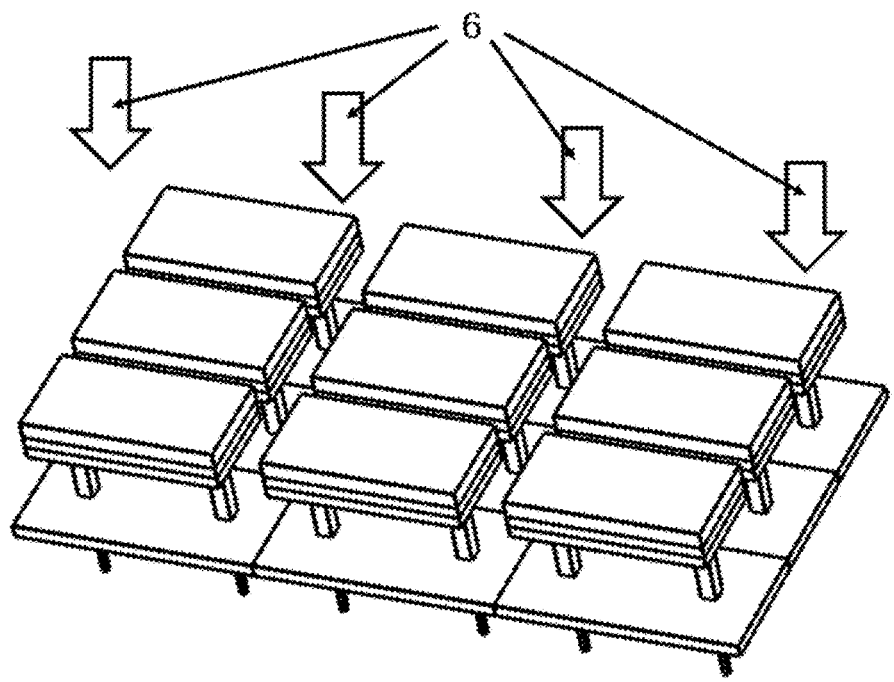
FIG. 5 shows a schematic structural diagram of a terahertz detector according to another exemplary embodiment of the present disclosure, where the terahertz detector includes a plurality of detection units arranged in a plane array.
Figure 6:
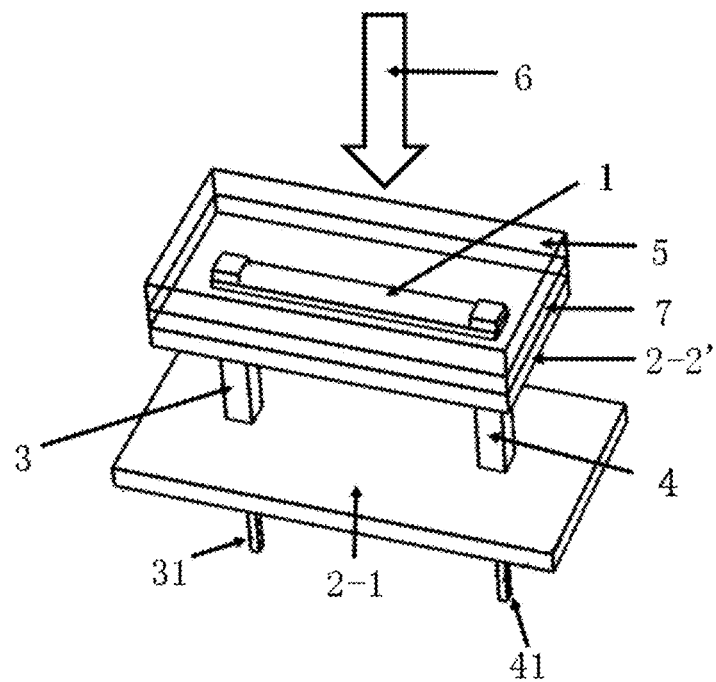
FIG. 6 shows a schematic structural diagram of a detection unit of the terahertz detector shown in FIG. 5.

FIG. 5 and FIG. 6 show a terahertz detector according to yet another exemplary embodiment of the present disclosure. As shown in FIG. 5 and FIG. 6, the terahertz detector includes a substrate 2 and a plurality of detection units arranged in a plane array. The substrate 2 includes a first substrate 2-1 and a plurality of second substrates 2-2' substantially parallel to and arranged at a certain distance from the first substrate 2-1. The plurality of detection units are arranged in one-to-one correspondence with the plurality of second substrates 2-2', and the channel material 1 of each detection unit is arranged on the second substrate 2-2'. First ends of the electrodes 3 and 4 of each detection unit have first ends are connected to the first substrate 2-1 and protrude from the side of the first substrate 2-1 away from the second substrate 2-2', and second ends of the electrodes 3 and 4 of each detection unit are connected to the second substrate 2-2' and are respectively in good ohmic contact with both ends of the channel material 1 arranged on the second substrate 2-2' in the longitudinal direction. The three-dimensional graphene 5 is arranged on the second substrate 2-2' and is in indirect thermal contact with the channel material 1. The terahertz detector may perform the detection through pyroelectric effect. When the terahertz wave 6 to be measured irradiates the surface of the detector, the three-dimensional graphene 5 may absorb the terahertz wave 6 and transfer energy to the channel material 1 in the form of heat to causes an increase of the temperature of the channel material 1, which leads to a pyroelectric effect and generates thermoelectromotive force between the electrodes 3 and 4. By measuring the thermoelectromotive force using an electrical detection device, an intensity of the terahertz wave 6 to be measured may be obtained As shown in FIG. 6, each second substrate 2-2' is further provided with an insulating and thermally conductive layer 7 covering the channel material 1, and the three-dimensional graphene 5 is arranged on a side of the insulating and thermally conductive layer 7 away from the channel material 1. In this way, the insulating and thermally conductive layer 7 has a good thermal contact with the three-dimensional graphene 5 and the channel material 1, so that an indirect thermal contact is formed between the three-dimensional graphene 5 and the channel material 1. It should be noted that in some other embodiments of the present disclosure, the insulating and thermally conductive layer 7 may not be provided, so that the channel material 1 is in direct thermal contact with the three-dimensional graphene 5.

Although a plurality of detection units arranged in a plane array are shown in this embodiment, it should be noted that in some other embodiments of the present disclosure, it is also possible to provide only one such detection unit or a plurality of such detection units arranged in a linear array.

As shown in FIG. 6, in an exemplary embodiment, the first ends of the electrodes 3 and 4 protruding from the side of the first substrate 2-1 away from the second substrate 2-2' are provided with tapered pin structures 31 and 34, to facilitate connection with a circuit.

In an exemplary embodiment not shown in the present disclosure, the terahertz detector further includes a wire or a chip suitable for connecting the electrodes 3 and 4 of each detection unit with a positive probe and a negative probe of the electrical detection device, so that the intensity of the terahertz wave 6 to be measured may be obtained by reading an electrical quantity change on the electrical detection device. According to specific detection principles, the electrical quantities that may be measured include but are not limited to voltage, current, resistance, capacitance, and so on. The electrical detection device here includes, but is not limited to, digital source meter, oscilloscope, and lock-in amplifier. It should be noted that in a case that the terahertz detector includes a plurality of detector units arranged in a linear array or a plane array, the terahertz detector may further include a corresponding electrical signal processing module used to process electrical signals of the plurality of detection units.

The present disclosure further provides a method of manufacturing the terahertz detector described above, including following steps.

In step 1, the channel material 1 is prepared. The channel material 1 may be used to grow a single layer of graphene, for example, by a chemical vapor deposition method. The single layer of graphene may be then transferred to filter paper, and the filter paper may be cut into narrow strips of appropriate size as the channel material 1.

In step 2, the cut channel material 1 is transferred to the substrate 2.

In step 3, a mask is drawn, and two electrodes 3 and 4 are made on both ends of the channel material 1 by using a mask evaporation method.

In step 4, the three-dimensional graphene 5 is prepared. For example, a three-dimensional graphene block may be prepared by a hydration heat method, and cut into a shape with an appropriate size by using a laser cutting method.

In step 5, the three-dimensional graphene 5 may be fixed to the channel material 1, for example, by using thermally conductive silica gel with good thermal conductivity.

After the preparation is completed, a resistivity between the electrodes 3 and 4 may be measured by using a digital source meter so as to check whether the terahertz detector is turned on.

Those skilled in the art may understand that the embodiments described above are exemplary, and those skilled in the art may make improvements. The structures described in the embodiments may be combined freely without conflicts in structure or principle.

After describing the preferred embodiments of the present disclosure in detail, those skilled in the art may clearly understand that various changes and modifications may be made without departing from the scope and spirit of the appended claims, and the present disclosure is not limited to implementations of the exemplary embodiments described in the present disclosure.

What is claimed is:

1. A terahertz detector, comprising:
   a substrate; and
   at least one detection unit, wherein each detection unit comprises:
     a channel material arranged on the substrate,
     two electrodes respectively in ohmic contact with both ends of the channel material in a longitudinal direction, and
   a three-dimensional graphene in direct or indirect thermal contact with the channel material,
   wherein the substrate has a U-shaped structure, both ends of the channel material in the longitudinal direction are respectively fixed on both side portions of the U-shaped structure, and the three-dimensional graphene is arranged between a bottom of the U-shaped structure and the channel material.

2. The terahertz detector of claim 1, wherein the three-dimensional graphene is in direct or indirect thermal contact with one end of the channel material.

3. The terahertz detector of claim 2, wherein the three-dimensional graphene is arranged at a contact between the channel material and the electrode.

4. The terahertz detector of claim 3, wherein the three-dimensional graphene has a cuboid structure with a long side parallel to the longitudinal direction of the channel material.

5. The terahertz detector of claim 2, wherein the three-dimensional graphene has a cuboid structure with a long side parallel to the longitudinal direction of the channel material.

6. The terahertz detector of claim 1, wherein the three-dimensional graphene is adhered to the channel material.

7. The terahertz detector of claim 6, wherein the three-dimensional graphene has a cuboid structure with a long side parallel to the longitudinal direction of the channel material.

8. The terahertz detector of claim 1, wherein each electrode has two ends that extend to an outside of the channel material in a direction perpendicular to the longitudinal direction of the channel material and that are connected to the substrate.

9. The terahertz detector of claim 1, wherein the three-dimensional graphene has a cuboid structure with a long side parallel to the longitudinal direction of the channel material.

10. The terahertz detector of claim 1, wherein the substrate comprises a first substrate and a second substrate arranged at a distance from the first substrate, the channel material of each detection unit has a first end in the longitudinal direction that is connected to the first substrate, and a second end in the longitudinal direction protruding from a side of the second substrate away from the first substrate, both electrodes of each detection unit are respectively arranged on the first substrate and the second substrate, and the three-dimensional graphene is arranged on the second substrate and is in thermal contact with the second end of the channel material protruding from the second substrate.

11. The terahertz detector of claim 10, wherein the plurality of detection units are arranged in a plane array or a linear array.

12. The terahertz detector of claim 1, wherein the substrate comprises a first substrate and at least one second substrate arranged at a distance from the first substrate, the at least one detection unit is arranged in a one-to-one correspondence with the at least one second substrate; wherein the channel material of each detection unit is arranged on the second substrate, first ends of both electrodes of each detection unit are connected to the first substrate and protrude from a side of the first substrate away from the second substrate, and second ends of both electrodes of the each detection unit are in ohmic contact with both ends of the channel material arranged on the second substrate in the longitudinal direction, and the three-dimensional graphene is arranged on the second substrate.

13. The terahertz detector of claim 12, further comprising an insulating and thermally conductive layer arranged between the channel material and the three-dimensional graphene.

14. The terahertz detector of claim 13, wherein the plurality of detection units are arranged in a plane array or a linear array.

15. The terahertz detector of claim 12, wherein the first end of each electrode is provided with a tapered pin structure.

16. The terahertz detector of claim 15, wherein the plurality of detection units are arranged in a plane array or a linear array.

17. The terahertz detector of claim 12, wherein the plurality of detection units are arranged in a plane array or a linear array.

18. The terahertz detector of claim 1, wherein the three-dimensional graphene has a cuboid structure with a long side parallel to the longitudinal direction of the channel material.

19. A method of manufacturing a terahertz detector, comprising:
- preparing a channel material;
- transferring the channel material to a substrate having a U-shaped structure;
- making two electrodes on both ends of the channel material in a longitudinal direction;
- preparing a three-dimensional graphene; and
- fixing the three-dimensional graphene to the channel material,
- wherein transferring the channel material to a substrate comprises fixing both ends of the channel material in the longitudinal direction respectively on both side portions of the U-shaped structure, and
- fixing the three-dimensional graphene to the channel material comprises arranging the three-dimensional graphene between a bottom of the U-shaped structure and the channel material.

* * * * *